United States Patent
Böffgen et al.

(10) Patent No.: US 10,157,248 B2
(45) Date of Patent: Dec. 18, 2018

(54) CIRCUIT SUITABLE FOR GENERATING RANDOM BITS AND CIRCUIT FOR GENERATING RANDOM BITS

(71) Applicant: SIEMENS AKTIENGESELLSCHAFT, München (DE)

(72) Inventors: Pascale Böffgen, München (DE); Markus Dichtl, München (DE)

(73) Assignee: Siemens Aktiengesellschaft, München (DE)

( * ) Notice: Subject to any disclaimer, the term of this patent is extended or adjusted under 35 U.S.C. 154(b) by 143 days.

(21) Appl. No.: 15/033,630

(22) PCT Filed: Sep. 17, 2014

(86) PCT No.: PCT/EP2014/069756
§ 371 (c)(1),
(2) Date: Apr. 30, 2016

(87) PCT Pub. No.: WO2015/062780
PCT Pub. Date: May 7, 2015

(65) Prior Publication Data
US 2016/0253438 A1 Sep. 1, 2016

(30) Foreign Application Priority Data
Oct. 31, 2013 (DE) .................. 10 2013 222 218

(51) Int. Cl.
G06F 17/50 (2006.01)
G06F 7/58 (2006.01)

(52) U.S. Cl.
CPC .......... G06F 17/505 (2013.01); G06F 7/588 (2013.01)

(58) Field of Classification Search
USPC ........................................... 716/104
See application file for complete search history.

(56) References Cited

U.S. PATENT DOCUMENTS 6,094,103 A 7/2000 Jeong et al.
7,449,961 B2 11/2008 Sai et al.
(Continued)

FOREIGN PATENT DOCUMENTS

CN 1620756 A 5/2005
CN 102007470 A 4/2011
(Continued)

OTHER PUBLICATIONS

Article "Digitaler Rauschgenerator im FPGA", Internet: URL:http://www.mikrocontroller.net/articles/Digitaler_Rauschgenerator_im_FPGA [archive.org May 17, 2012; retrieved Jan. 28, 2014].
(Continued)

*Primary Examiner* — Bryce Aisaka
(74) *Attorney, Agent, or Firm* — Lempia Summerfield Katz LLC

(57) ABSTRACT

The invention relates to a method and an apparatus for designing a circuit suitable for generating random bits and to a circuit for generating random bits. A random bit string which is used as a binary random number is generated, for example. The proposed method and the apparatus as well as the circuit are used to implement random number generators, for example. A jth specific function from a set of bijective mappings is selected as the jth function, wherein the jth specific function carries out a jth fixed-point-free mapping. At least one ith mapping device is then selected. An ith specific function from a set of bijective mappings is assigned to the ith function, with the result that an ith concatenation of the i functions carries out an ith fixed-point-free mapping.

6 Claims, 1 Drawing Sheet

(56) References Cited

U.S. PATENT DOCUMENTS

| | | |
|---|---|---|
| 7,797,361 B2 | 9/2010 | Lazich et al. |
| 8,099,449 B1 | 1/2012 | Schultz |
| 2002/0171410 A1 | 11/2002 | Akahane et al. |
| 2004/0139340 A1* | 7/2004 | Johnson .................. G06F 21/14 |
| | | 713/194 |
| 2008/0304667 A1 | 12/2008 | Mihaljevic et al. |
| 2011/0032041 A1 | 2/2011 | Dichtl |
| 2014/0354327 A1 | 12/2014 | Boffgen et al. |

FOREIGN PATENT DOCUMENTS

| | | |
|---|---|---|
| CN | 103034472 A | 4/2013 |
| DE | 102004047425 B4 | 6/2007 |
| EP | 1643643 B1 | 1/2008 |
| EP | 2799980 A3 | 11/2014 |
| WO | WO2014177300 A1 | 11/2014 |

OTHER PUBLICATIONS

German Search Report for German Application No. 10 2013 222 218.1, dated Jan. 31, 2014, with English Translation.
PCT International Search Report for corresponding PCT/EP2014/069756, dated Nov. 25, 2014, with English Translation.
Chinese Office Action for Chinese Patent Application No. 201480059738.3 dated Sep. 28, 2017.

* cited by examiner

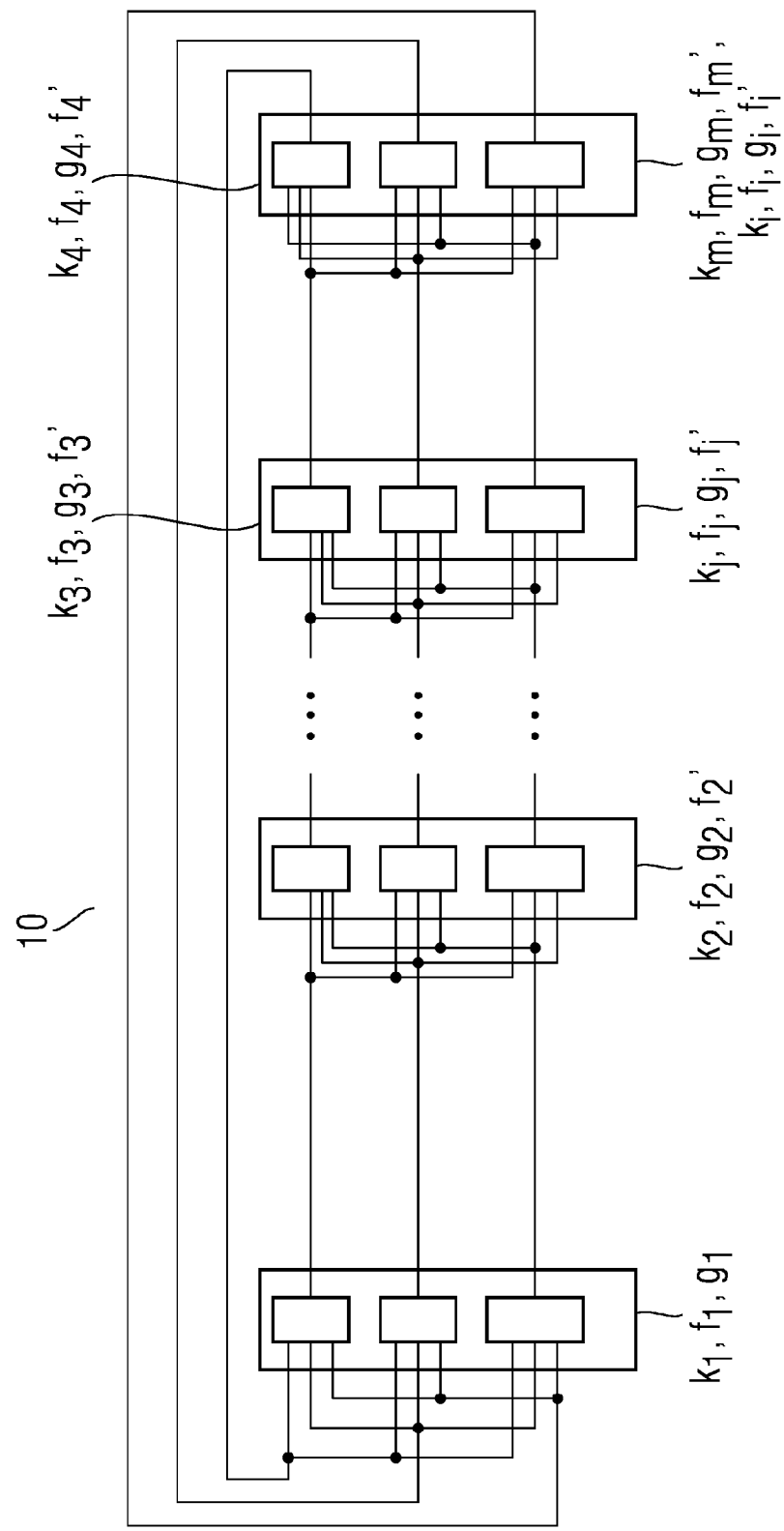

CIRCUIT SUITABLE FOR GENERATING RANDOM BITS AND CIRCUIT FOR GENERATING RANDOM BITS

This application is the National Stage of International Application No. PCT/EP2014/069756, filed Sep. 17, 2014, which claims the benefit of German Patent Application No. DE 10 2013 222 218.1, filed Oct. 31, 2013. The entire contents of these documents are hereby incorporated herein by reference.

BACKGROUND

The present embodiments relate to designing a circuit suitable for generating random bits and to a circuit for generating random bits.

In security-relevant applications (e.g., in the case of asymmetric authentication methods), random bit strings are to be provided as binary random numbers. In this case, the lowest hardware complexity possible may be pursued (e.g., it in the case of mobile applications). Known measures for generating random numbers use analog random sources.

As analog random sources, noise sources, such as, for example, the noise from zener diodes, are amplified and digitized. In this case, digital and analog circuitry are combined.

In addition, ring oscillators and variations thereof are used as random number generators. In the case of ring oscillators, which are constructed from an uneven number of inverters connected in series, random jitter, for example, arises from fluctuating propagation times for the signals through the inverters. This jitter (e.g., an irregular fluctuation over time in state changes for the signals sent through the inverters) may be accumulated when there are multiple passes through the ring oscillator circuit, so that ultimately a random analog signal is produced.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved method and an apparatus for designing complex and/or flexible circuits are provided.

An apparatus for generating random bits includes multiple mapping devices. A respective mapping device is configured to map a prescribed number n of input signals to a prescribed number p of output signals using a combinational mapping. In this case, the mapping devices are concatenated to one another, and at least one feedback loop is formed. The feedback loop may be in a form such that a state change for at least one output signal from a selected mapping device is supplied as a state change for at least one input signal to another mapping device.

In one embodiment, the other mapping device is not a directly adjacent mapping device.

A feedback loop may be available such that a state change for at least one feedback output signal from a particular mapping device is supplied as a state change for at least one input signal to another mapping device such that one or more output signals from the particular mapping device is influenced by the state change of the feedback output signal.

At least one combinational mapping is set up such that a state change for an input signal to a respective mapping device is mapped on average to more than one output signal from the respective mapping device.

The number of n input signals to a respective mapping device may correspond to the number p of output signals. Alternatively, n may not be equal to p (e.g., a respective mapping device may be used to map the states of the input signals to states of output signals, the number of output signals being less or greater than the number of input signals for a respective mapping device).

The mapping devices may be logic or combinational gates that implement, for example, a bijective mapping of n input signals to n output signals. The input signals fluctuate between levels that may be assigned to logic states, such as 1, or high, or 0, or low, bits. A bijective mapping may be a unique mapping between the $2^n$ possible logic values of the input signals and the $2^n$ logic values of the output signals.

In this respect, the mapping devices in embodiments of the apparatus are used to obtain an n-path ring oscillator. The mapping devices may also be referred to as nodes or gates. For example, the respective combinational mapping is configured such that on average a state change for an input signal involves a state change on more than one output signal. This results in a respective jitter in the input signal being mapped to multiple output signals and therefore being amplified. Once jitter has occurred in a signal, the jitter is copied to multiple output paths using the mapping devices or the combinational mappings implemented therein. As a result of this it is hardly possible to compensate for jitter components.

In the case of the apparatus, it is also possible to refer to a multipath ring oscillator circuit. In comparison with conventional single-path ring oscillators, there is the particular advantage that a higher data rate may be used to tap off random bit values. By way of example, a random bit signal may be derived on one or more of the data paths that are obtained as a result of the n input and output signals.

It can be said that the apparatus develops "oscillations" or signal changes propagate in the circuit. Preferably, at least one of the output signals is causally dependent on itself by being fed back, the feedback being effected using at least one interposed mapping.

A particular advantage for a multipath ring oscillator of this kind is that it has no fixed point. The reason is that the existence of a fixed point can result in the ring entering an oscillation-free steady state, which means that no further random bits can be generated.

It is known practice, from the prior art, to continue to randomly generate a ring circuit having a particular length until a fixed-point-free multipath ring oscillator is found.

A method for designing a circuit suitable for generating random bits is provided. The circuit has a number m of mapping devices. Each of the mapping devices is supplied a number n of input bits, where n is a value greater than 1. Each of the mapping devices uses a respective function to carry out a bijective mapping of the n input bits to n output bits. The method include selecting a j-th mapping device from the first mapping device to m-th mapping device and prescribing a j-th specific function from a set of bijective mappings as the j-th function-. A j-th concatenation of the j functions carries out a j-th fixed-point-free mapping when the j-th specific function is prescribed as the j-th function. The j-th concatenation applies the j functions in an ascending order starting with the first function. The method also includes selecting at least one i-th mapping device from the first mapping device to m-th mapping device, where i is not equal to j, and prescribing an i-th specific function from a set of bijective mappings as the i-th function-. An i-th concatenation of the i functions carries out an i-th fixed-point-free mapping when the i-th specific function is prescribed as the i-th function. The i-th concatenation applies the i functions in an ascending order starting with the first function.

Thus, by way of example, n signals pass through a ring-shaped circuit having m mapping devices (e.g., nodes). Each node is constructed from logic gates. Each of the nodes has n input and output bits. The nodes are chosen such that the mapping of the n input bits to the n output bits is a bijective mapping or bijection (e.g., if the inputs assume all possible $2^n$ values, then the outputs also assume all possible $2^n$ values, but generally in a different order).

For example, the circuit is a multipath ring oscillator. For example, a state change for an input signal to a respective mapping device results on average in a change in more than one output signal.

In order to provide that a ring-shaped circuit of this kind (e.g., a ring) oscillates perpetually, the circuit is to not have a fixed point. In order to describe the circumstances of the fixed point more accurately, the ring is broken at an arbitrary but fixed position between the nodes.

There is then a circuit having n input bits that uses m nodes, each of which carries out a bijective mapping $f_i$ for an index i of the values 1 to m from n input bits to n output bits, to deliver n output bits after the m-th node.

For example, an m-th mapping or overall mapping $f_m'$ for the broken ring is provided by an m-th concatenation $f_m' = f_m \circ f_{m-1} \circ f_{m-2} \circ \ldots \circ f_2 \circ f_1$. A concatenation of functions is to be read from right to left in the present application (e.g., $f_1$ is applied first, then $f_2$, etc.). In this case, application provides that the first function $f_1$ is applied to a first input tuple on the first mapping device. The input tuple is formed from the n input bits (e.g., the first input tuple is mapped to a first output tuple based on a mapping specification of the first function). The second function is applied particularly to the first output tuple, which then forms a second input tuple for the second mapping device. The second mapping device then delivers a second output tuple. A third function is then applied to the second output tuple, for example, etc.

The whole ring is free of fixed points precisely when, for all possible n tuples x, the first input tuple is deemed to be $f_m'(x) \neq x$.

Verbally (e.g., for all possible n tuples x), the first input tuple is not the same as the m-th output tuple on the m-th mapping device.

According to one or more of the present embodiments, the j-th function selected for the j-th mapping device is a j-th specific function from a set of bijective mappings, so that a j-th concatenation of the j functions carries out a j-th fixed-point-free mapping. Bijections from n to n bits are picked as candidates for the j-th function until a j-th specific function has been found that satisfies the condition that the concatenation of all previous functions in the ring up to the j-th function is free of fixed points, and this is used as the j-th function. By way of example, the j-th function may be picked at random.

At least one i-th mapping device is then selected from the first to m-th mapping device, where i is not equal to j. The i-th function is assigned an i-th specific function from a set of bijective mappings, so that an i-th concatenation of the i functions carries out an i-th fixed-point-free mapping.

In this case too, bijections from n to n bits are examined as candidates for the i-th function until, for all possible n tuples x, the application of the concatenation of the first to i-th functions to the first input tuple delivers an i-th output tuple that is not equal to the first input tuple. By way of example, the i-th function may be picked at random.

In this case, the mapping of the first input tuple to the i-th output tuple (e.g., the i-th concatenation of the first to i-th functions) is thus examined for the property of being free of fixed points. It is thus possible to consider a partial concatenation within the circuit.

The method described allows efficient design of ring-shaped circuits that are of any length and flexibly shortenable for generating random bits.

The circuit designed based on the described method allows flexible changeover of the feedback from the output of the j-th mapping device to the input of the first mapping device to feedback from the output of the i-th mapping device to the input of the first mapping device. In this case, fixed-point-free rings are produced with both feedbacks.

According to one development, based on the design method described above, each of the m-1 mapping devices from the first mapping device to m-th mapping device is selected, and a respective specific function is assigned to the respective function, so that each concatenation $f_j' = f_j \circ \ldots \circ f_1$, for all j from 1 to m, including 1 and m, is a fixed-point-free mapping of the first input tuple. In this case, it is sufficient for a fixed-point-free function to be chosen for the first function $f_1$, since no concatenation is applied for the creation of the first output tuple. This provides particularly great flexibility for the shortening of the circuit.

The circuit designed in this manner allows the use of a ring oscillator or multipath ring oscillator of flexible length. It is possible to take the fixed-point-free ring designed using the described method and, without requiring additional gates, to design fixed-point-free rings of variable length. By way of example, by feeding back the output bits from an arbitrary i-th node from the m nodes to the inputs of the first node, fixed-point-free rings of length i are obtained (e.g., lengths with values from 1 to m).

For a randomly selected ring having, by way of example, 100 nodes and 4 input and output bits in each case, the probability of obtaining a fixed-point-free ring that may also be shortened to arbitrary lengths and, in that case, retains a fixed-point-free property is only approximately $2.53 \cdot 10^{-49}$. Such a method would be unfeasible. By contrast, an efficient iterative solution is indicated based on the method described.

The iterative method described is applied only once during the design of the ring. Later alterations that shorten the ring (e.g., from a length of j mapping devices, where j is between 1 and m or may be m) to i mapping devices, where i is greater than or equal to 1 and less than j, advantageously create no fresh complexity for providing a fixed-point-free oscillator.

According to one refinement, the circuit is in the form of a multipath ring oscillator. This allows the efficient design of a fixed-point-free circuit in which a large number n exists as input bits per mapping device, and a variable feedback to the first mapping device is possible, so that the ring shortened by the feedback is also free of fixed points.

One or more of the present embodiments also relate to an apparatus for designing a circuit suitable for generating random bits-. The circuit has a number m of mapping devices. Each of the mapping devices obtains a number n of input bits, where n is a value greater than 1. Each of the mapping devices may use a respective function to carry out a bijective mapping of the n input bits to n output bits. The apparatus includes a j-th unit for selecting a j-th mapping device from the first mapping device to m-th mapping device and for prescribing a j-th specific function from a set of bijective mappings as the j-th function. A j-th concatenation of the j functions may carry out a j-th fixed-point-free mapping when the j-th specific function is prescribed as the j-th function, and the j-th concatenation may apply the j functions in an ascending order starting with the first function. The apparatus also includes an i-th unit for selecting at least one further i-th mapping device from the first mapping device to m-th mapping device, where i is not equal to j, and for prescribing an i-th specific function from a set of bijective mappings as the i-th function. An i-th concatenation of the i functions may carry out an i-th fixed-point-free mapping when the i-th specific function is prescribed as the i-th function, and the i-th concatenation may apply the i functions in an ascending order starting with the first function.

The apparatus is used to ascertain a circuit that is flexible in use. Fixed-point-free rings of variable length may be produced without additional complexity in terms of gates within the circuit using suitable changeover of the connecting lines. A ring of length m that is ascertained using the apparatus also provides suitable rings of shorter lengths on a flexible basis.

The j-th unit and the i-th unit may be implemented in hardware and/or even in software. When implemented in hardware, the respective unit may be in the form of an apparatus or in the form of part of an apparatus (e.g., in the form of a computer or in the form of a microprocessor). When implemented in software, the respective unit may be in the form of a computer program product, in the form of a function, in the form of a routine, in the form of part of a program code, or in the form of an executable object.

The present embodiments also relate to a circuit for generating random bits-.The circuit includes a number m of mapping devices. Each of the mapping devices obtains a number n of input bits, where n is a value greater than 1. Each of the mapping devices may use a respective function to carry out a bijective mapping of the n input bits to n output bits. A j-th mapping device may be selected from the first mapping device to m-th mapping device, and a j-th specific function from a set of bijective mappings may be prescribed as the j-th function. A j-th concatenation of the j functions may carry out a j-th fixed-point-free mapping when the j-th specific function is prescribed as the j-th function, and the j-th concatenation may apply the j functions in an ascending order starting with the first function. At least one further i-th mapping device may be selected from the first mapping device to m-th mapping device, where i is not equal to j, and an i-th specific function from a set of bijective mappings may be prescribed as the i-th function. An i-th concatenation of the i functions may carry out an i-th fixed-point-free mapping when the i-th specific function is prescribed as the i-th function, and the i-th concatenation may apply the i functions in an ascending order starting with the first function.

The circuit or the ring of length m may be shortened on a flexible basis without requiring additional gates. It is possible to change over between feedback from the output of the j-th mapping device to the input of the first mapping device to feedback from the output of the i-th mapping device to the input of the first mapping device. Both rings produced are free of fixed points.

Keeping the length of the ring flexible may make particular sense in order to be able to influence the power consumption of the ring. A further advantage of rings of variable length is that, since very short multipath ring oscillators tend toward periodic rather than chaotic oscillation, a ring according to one or more of the present embodiments allows a short ring in which chaotic oscillation occurs to be picked without changing the logic functions.

BRIEF DESCRIPTION OF THE DRAWINGS

FIG. 1 shows a schematic illustration of a circuit according to an exemplary embodiment.

DETAILED DESCRIPTION

FIG. 1 shows one embodiment of a circuit 10 having a number m (e.g., m=4) of mapping devices $K_1$, $K_2$, $K_3=K_j$, $K_4=K_i=K_m$.

For the sake of the example, a circuit of length 4 is generated, and the circuit is closed to form a ring. FIG. 1 shows a multipath ring oscillator having three paths (n=3).

On the first mapping device $K_1$, a random bijection is chosen as the first function $f_1$, so that the first mapping is free of fixed points. Hence, a first specific function $g_1$ has been found. On the second mapping device $K_2$, a bijection is chosen as the second function $f_2$, so that the second concatenation $f_2'$ including the first function $f_1$ and the second function $f_2$ is free of fixed points. Hence, a second specific function $g_2$ has been found. Similarly, on the third mapping device $K_3$, a bijection is chosen as the third function $f_3$, so that the third concatenation $f_3'$ including the first function $f_1$, the second function $f_2$ and the third function $f_3$ is free of fixed points. Hence, a third specific function $g_3$ has been found. Similarly, on the fourth mapping device $K_4$, a bijection is chosen as the fourth function $f_4$, so that the fourth concatenation $f_4'$ including the first function $f_1$, the second function $f_2$, the third function $f_3$ and the fourth function $f_4$ is free of fixed points. Hence, a fourth specific function $g_4$ has been found.

The VHDL fragment below shows how a 4-path ring of length 4 is constructed from Spartan-3 look-up tables (LUTs) for a Xilinx chip. Each of the mapping devices $K_1$, $K_2$, $K_3$, $K_4$ includes 4 LUTs, each LUT mapping the 4 input bits to one output bit. The mapping on each mapping device $K_1$, $K_2$, $K_3$, $K_4$ is a bijection from the set of all bit 4 tuples to the set of all bit 4 tuples.

```
-- LUT4: 4-input Look-Up Table with general output
-- Spartan-3
-- Xilinx HDL Libraries Guide, version 12.2
LUT0inst:LUT4
generic map (INIT=>x"c92e")
port map
 (O=>output (4),I0=>output (0),I1=>output (1),I2=>output (2),I
 3=>output (3));
LUT1inst:LUT4
generic map (INIT=>x"a8da")
port map
 (O=>output (5),I0=>output (0),I1=>output (1),I2=>output (2),I
 3=>output (3));
LUT2inst:LUT4
generic map (INIT=>x"b1a3")
port map
 (O=>output (6),I0=>output (0),I1=>output (1),I2=>output (2),I
 3=>output (3));
LUT3inst:LUT4
generic map (INIT=>x"44eb")
port map
 (O=>output (7),I0=>output (0),I1=>output (1),I2=>output (2),I
 3=>output (3));
LUT4inst:LUT4
generic map (INIT=>x"21b7")
port map
 (O=>output (8),I0=>output (4),I1=>output (5),I2=>output (6),I
 3=>output (7));
LUT5inst:LUT4
generic map (INIT=>x"7a23")
port map
 (O=>output (9),I0=>output (4),I1=>output (5),I2=>output (6),I
```

-continued

```
3=>output (7));
LUT6inst:LUT4
generic map (INIT=>x"1d0f")
port map
 (O=>output (10),I0=>output (4),I1=>output (5),I2=>output (6),
 I3=>output (7));
LUT7inst:LUT4
generic map (INIT=>x"cda2")
port map
 (O=>output (11),I0=>output (4),I1=>output (5),I2=>output (6),
 I3=>output (7));
LUT8inst:LUT4
generic map (INIT=>x"6d2c")
port map
 (O=>output (12),I0=>output (8),I1=>output (9),I2=>output (10),
 I3=>output (11));
LUT9inst:LUT4
generic map (INIT=>x"5f81")
port map
 (O=>output (13),I0=>output (8),I,=>output (9),I2=>output (10),
 I3=>output (11));
LUT10inst:LUT4
generic map (INIT=>x"d8e8")
port map
 (O=>output (14),I0=>output (8),I1=>output (9),I2=>output (10),
 I3=>output (11));
LUT11inst:LUT4
generic map (INIT=>x"7658")
port map
 (O=>output (15),I0=>output (8),I1=>output (9),I2=>output (10),
 I3=>output (11));
LUT12inst:LUT4
generic map (INIT=>x"1c5e")
port map
 (O=>output (16),I0=>output (12),I1=>output (13),I2=>output
 (14),I3=>output (15));
LUT13inst:LUT4
generic map (INIT=>x"16e9")
port map
 (O=>output (17),I0=>output (12),I1=>output (13),I2=>output
 (14),I3=>output (15));
LUT14inst:LUT4
generic map (INIT=>x"9353")
port map
 (O=>output (18),I0=>output (12),I1=>output (13),I2=>output
 (14),I3=>output (15));
LUT15inst:LUT4
generic map (INIT=>x"bc31")
port map
 (O=>output (19),I0=>output (12),I1=>output (13),I2=>output
 (14),I3=>output (15));
```

In this case, the logic function of the LUT is provided as a hexadecimal parameter in the form of a table of values containing 16 bits as an INIT parameter (e.g., INIT=x"bc31" for the last LUT).

By way of example, the 4 assignments below allow the circuit 10 to be turned into a fixed-point-free ring of length 4 with the first mapping device K1, the second mapping device K2, the third mapping device K3 and the fourth mapping device K4:
output(0)<=output(16);
output(1)<=output(17);
output(2)<=output(18);
output(3)<=output(19);

By way of example, the 4 assignments below allow the circuit 10 to be shortened to form a fixed-point-free ring of length 2 with the first mapping device K1 and the second mapping device K2:
output(0)<=output(8);
output(1)<=output(9);
output(2)<=output(10);
output(3)<=output(11);

Flexible changeover between the lengths 4 and 2 may thus be provided possible.

Since this flexible changeover is possible for any lengths and for any shortening, the power consumption may be significantly reduced by the changeover, for example, and hence, adjusted to suit demands on a random number generator, depending on the field of use, without redesign of the circuit 10 being necessary.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for designing a circuit suitable for generating random bits, wherein the circuit comprises a number m of mapping devices, the method comprising:
  supplying a number n of input bits to each of the mapping devices, wherein n is a value greater than 1;
  implementing, by the mapping devices, a bijective mapping of n input bits to n output bits using a respective function;
  selecting a j-th mapping device from a first of the mapping devices to the m-th mapping device and prescribing a j-th specific function from a set of bijective mappings as the j-th function, wherein a j-th concatenation of the j functions carries out a j-th fixed-point-free mapping when the j-th specific function is prescribed as the j-th function;
  applying, by the j-th concatenation, the j functions in an ascending order starting with the first function;
  selecting at least one i-th mapping device from the first mapping device to the m-th mapping device, where i is not equal to j, and prescribing an i-th specific function from a set of bijective mappings as the i-th function, wherein an i-th concatenation of the i functions carries out an i-th fixed-point-free mapping when the i-th specific function is prescribed as the i-th function;
  applying, by the i-th concatenation, the i functions in an ascending order starting with the first function; and
  manufacturing the designed circuit suitable for generating random bits.

2. The method of claim 1, wherein each of the m mapping devices from the first mapping device to the m-th mapping device is selected and the selecting of the j-th mapping device or the selecting of the at least one i-th mapping device is taken as a basis for prescribing a respective specific function as the respective function.

3. The method of claim 2, wherein the circuit comprises a multipath ring oscillator.

4. The method of claim 1, wherein the circuit comprises a multipath ring oscillator.

5. An apparatus for designing a circuit suitable for generating random bits, wherein the circuit comprises a number m of mapping devices, the apparatus comprising:
  a first processor configured to:

select a j-th mapping device from a first of the mapping devices to the m-th mapping device; and prescribe a j-th specific function from a set of bijective mappings as the j-th function, wherein a j-th concatenation of the j functions is operable to carry out a j-th fixed-point-free mapping when the j-th specific function is prescribed as the j-th function, and wherein the j-th concatenation is operable to apply the j functions in an ascending order starting with the first function;

a second processor configured to:

select at least one further i-th mapping device from the first mapping device to the m-th mapping device, where i is not equal to j; and prescribe an i-th specific function from a set of bijective mappings as the i-th function, wherein an i-th concatenation of the i functions is operable to carry out an i-th fixed-point-free mapping when the i-th specific function is prescribed as the i-th function, and wherein the i-th concatenation is operable apply the i functions in an ascending order starting with the first function, wherein each of the mapping devices is operable to obtain a number n of input bits, where n is a value greater than 1, wherein each of the mapping devices is operable to use a respective function to carry out a bijective mapping of the n input bits to n output bits, and wherein the circuit is fabricated as deisgned by the apparatus.

6. A circuit for generating random bits, the circuit comprising:

a number m of mapping devices, wherein each of the mapping devices is configured to obtain a number n of input bits, where n is a value greater than 1, wherein each of the mapping devices is configured to use a respective function to carry out a bijective mapping of the n input bits to n output bits, wherein a j-th mapping device is selectable from the first mapping device to the m-th mapping device, and a j-th specific function from a set of bijective mappings is prescribable as the j-th function, wherein a j-th concatenation of the j functions is operable to carry out a j-th fixed-point-free mapping when the j-th specific function is prescribed as the j-th function, and the j-th concatenation is operable to apply the j functions in an ascending order starting with the first function, wherein at least one further i-th mapping device is selectable from the first mapping device to the m-th mapping device, where i is not equal to j, and an i-th specific function from a set of bijective mappings is prescribable as the i-th function, and wherein an i-th concatenation of the i functions is operable to carry out an i-th fixed-point-free mapping when the i-th specific function is prescribed as the i-th function, and the i-th concatenation is operable to apply the i functions in an ascending order starting with the first function.

* * * * *

UNITED STATES PATENT AND TRADEMARK OFFICE
CERTIFICATE OF CORRECTION

PATENT NO. : 10,157,248 B2  
APPLICATION NO. : 15/033630  
DATED : December 18, 2018  
INVENTOR(S) : Pascale Böffgen and Markus Dichtl It is certified that error appears in the above-identified patent and that said Letters Patent is hereby corrected as shown below:

On the Title Page

Item (54) and in the Specification, Column 1, Lines 1-3:
"CIRCUIT SUITABLE FOR GENERATING RANDOM BITS AND CIRCUIT FOR GENERATING RANDOM BITS"

Should be replaced with:
"DESIGN OF A CIRCUIT SUITABLE FOR GENERATING RANDOM BITS AND CIRCUIT FOR GENERATING RANDOM BITS"

Signed and Sealed this  
Twenty-seventh Day of August, 2019

Andrei Iancu  
*Director of the United States Patent and Trademark Office*